(12) United States Patent
Nobunaga et al.

(10) Patent No.: US 8,462,536 B2
(45) Date of Patent: Jun. 11, 2013

(54) METHOD AND APPARATUS FOR ADDRESSING MEMORY ARRAYS

(75) Inventors: Dean Nobunaga, Cupertino, CA (US); Terry Grunzke, Boise, ID (US); Ali Ghalam, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 187 days.

(21) Appl. No.: 13/046,248

(22) Filed: Mar. 11, 2011

(65) Prior Publication Data

US 2012/0230110 A1    Sep. 13, 2012

(51) Int. Cl.
*G11C 5/00* (2006.01)
*G11C 8/00* (2006.01)
*G06F 13/00* (2006.01)

(52) U.S. Cl.
USPC ......... 365/52; 365/230.03; 711/103; 711/166

(58) Field of Classification Search
USPC .................. 365/52, 185.17, 230.03; 711/103, 711/105, 165, 166, 167
See application file for complete search history.

(56) References Cited

U.S. PATENT DOCUMENTS

| | | | | |
|---|---|---|---|---|
| 6,731,565 B2 * | 5/2004 | Huang | ...................... | 365/230.03 |
| 7,215,561 B2 * | 5/2007 | Park et al. | ................ | 365/230.03 |
| 7,480,201 B2 * | 1/2009 | Bartley et al. | ................... | 365/52 |
| 7,733,680 B2 * | 6/2010 | Im | ................................... | 365/52 |
| 7,965,530 B2 * | 6/2011 | Han et al. | ........................ | 365/52 |
| 8,001,325 B2 * | 8/2011 | Conley et al. | ................. | 711/103 |
| 8,037,272 B2 * | 10/2011 | Bartley et al. | ................. | 711/165 |
| 8,279,670 B2 * | 10/2012 | Futatsuyama et al. | ... | 365/185.17 |

* cited by examiner

*Primary Examiner* — Trong Phan

(74) *Attorney, Agent, or Firm* — Winkle, PLLC

(57) ABSTRACT

The present description relates to non-volatile memory arrays and the operation thereof In at least one embodiment, the non-volatile memory array may include a plurality of memory modules coupled in a daisy chain with enable in/out signals, and a single chip enable signal coupled in parallel to each memory module. With such a configuration, all memory units within each of the memory modules of each memory array may be addressed with the single chip enable signal.

7 Claims, 5 Drawing Sheets

METHOD AND APPARATUS FOR ADDRESSING MEMORY ARRAYS

BACKGROUND OF THE INVENTION

The present disclosure relates generally to the fabrication of microelectronic memory. The microelectronic memory may be non-volatile, wherein the memory can retain stored information even when not powered.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The disclosure will be described with additional specificity and detail through use of the accompanying drawings, such that the advantages of the present disclosure can be more readily ascertained, in which:

DETAILED DESCRIPTION

Figure 1:
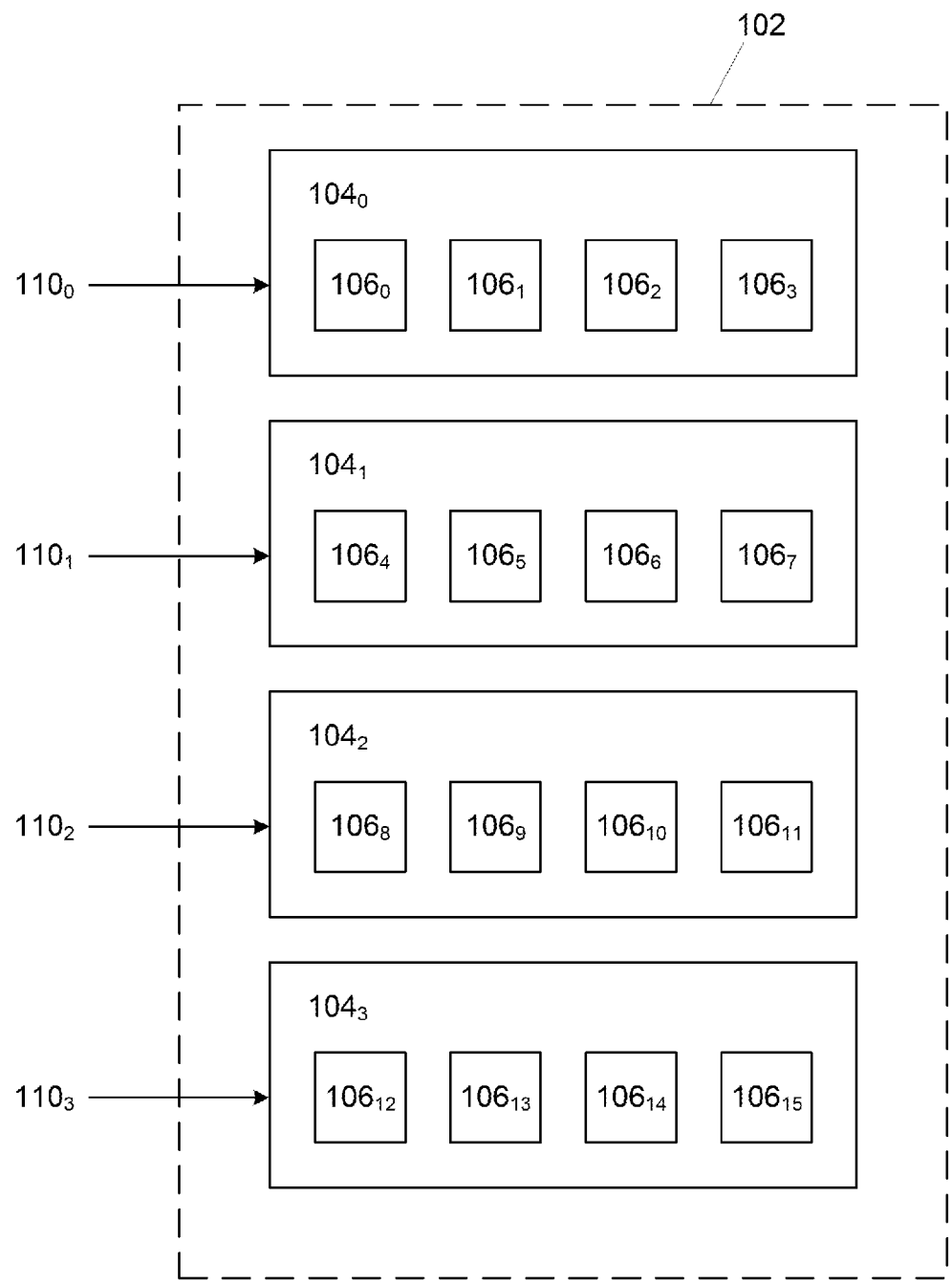
FIG. 1 is a schematic depiction illustrating a memory array being addressed with a chip enable signal per each memory module, as known in the art.

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. References within this specification to "one embodiment" or "an embodiment" mean that a particular feature, structure, or characteristic described in connection with the embodiment is included in at least one implementation encompassed within the present invention. Therefore, the use of the phrase "one embodiment" or "in an embodiment" does not necessarily refer to the same embodiment. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

Embodiments of the present description relate to non-volatile memory arrays and the operation thereof. In at least one embodiment, the non-volatile memory array may include a plurality of memory modules coupled in a daisy chain with enable in/out signals, and a single chip enable signal coupled in parallel to each memory module. With such a configuration, all memory units within each of the memory modules of each memory array may be addressed with the single chip enable signal.

FIG. 1 shows a non-volatile memory array 102, as known in the art, comprising, for illustration purposes, four (4) memory modules $104_0$, $104_1$, $104_2$, and $104_3$, each having four (4) memory units or microelectronic memory chips (i.e. memory module $104_0$ having memory units $106_0$-$106_3$, memory module $104_1$ having memory units $106_4$-$106_7$, memory module $104_2$ having memory units $106_8$-$106_{11}$, and memory module $104_3$ having memory units $106_{12}$-$106_{15}$). It is understood that the four memory module by four memory unit per memory module (i.e. sixteen (16) total memory units) arrangement for the non-volatile memory array 102 of FIG. 1 is merely exemplary and may be any appropriate size (i.e. any appropriate number of memory modules and any appropriate number of memory units within each memory module). The memory modules (e.g. $104_0$, $104_1$, $104_2$, $104_3$, and the like) may hereinafter be collectively referred to as $104_n$ (where n is any of a selected number of memory modules) and the memory units (e.g. $106_0$-$106_{15}$, and the like) may hereinafter be collectively referred to as memory units $106_m$ (where m is any of a selected number of memory units).

In order for a host controller (not shown) to properly access the memory modules $104_n$ and its corresponding memory units $106_m$ within each corresponding memory module $104_n$, the host controller must address or identify each memory module $104_n$ and memory units $106_m$, within each memory module $104_n$. This may be achieved by sending a chip enable signal (e.g. $110_0$, $110_1$, $110_2$, and $110_3$ (hereinafter collectively $110_n$)) to each memory module $104_0$, $104_1$, $104_2$, and $104_3$, respectively. With the chip enable signal $110_n$ and information regarding the memory units $106_m$ that is hard coded within each memory module $104_n$, each memory unit $106_m$ can be uniquely addressed. The specific process for addressing each memory unit $106_n$ by the host controller is well known in the art and will not be discussed herein.

Referring again to FIG. 1, the memory array 102 would require four (4) chip enable signals $110_n$ to address each of the four (4) memory modules $104_n$. Furthermore, if the size of the memory array 102 were enlarged to thirty-two (32) total memory units $106_m$ with four (4) memory units $106_m$ per memory module $104_n$, eight (8) chip enable signals $110_n$ would be required. If the size of the memory array 102 were enlarged to sixty-four (64) total memory units $106_n$ with four (4) memory units $106_n$ per memory module $104_n$, sixteen (16) chip enable signals $110_n$ would be required, and so on. With microelectronic devices incorporating an ever increasing amount of memory, the increasing number chip enable signals $110_n$ required for addressing memory arrays 102 may become an issue. These issues can include, but are not limited to, increased host controller complexity, increased host controller size, increased space for board level routing, increased cost, capacity limitations, and the like, as will be understood to those skilled in the art.

Figure 2:
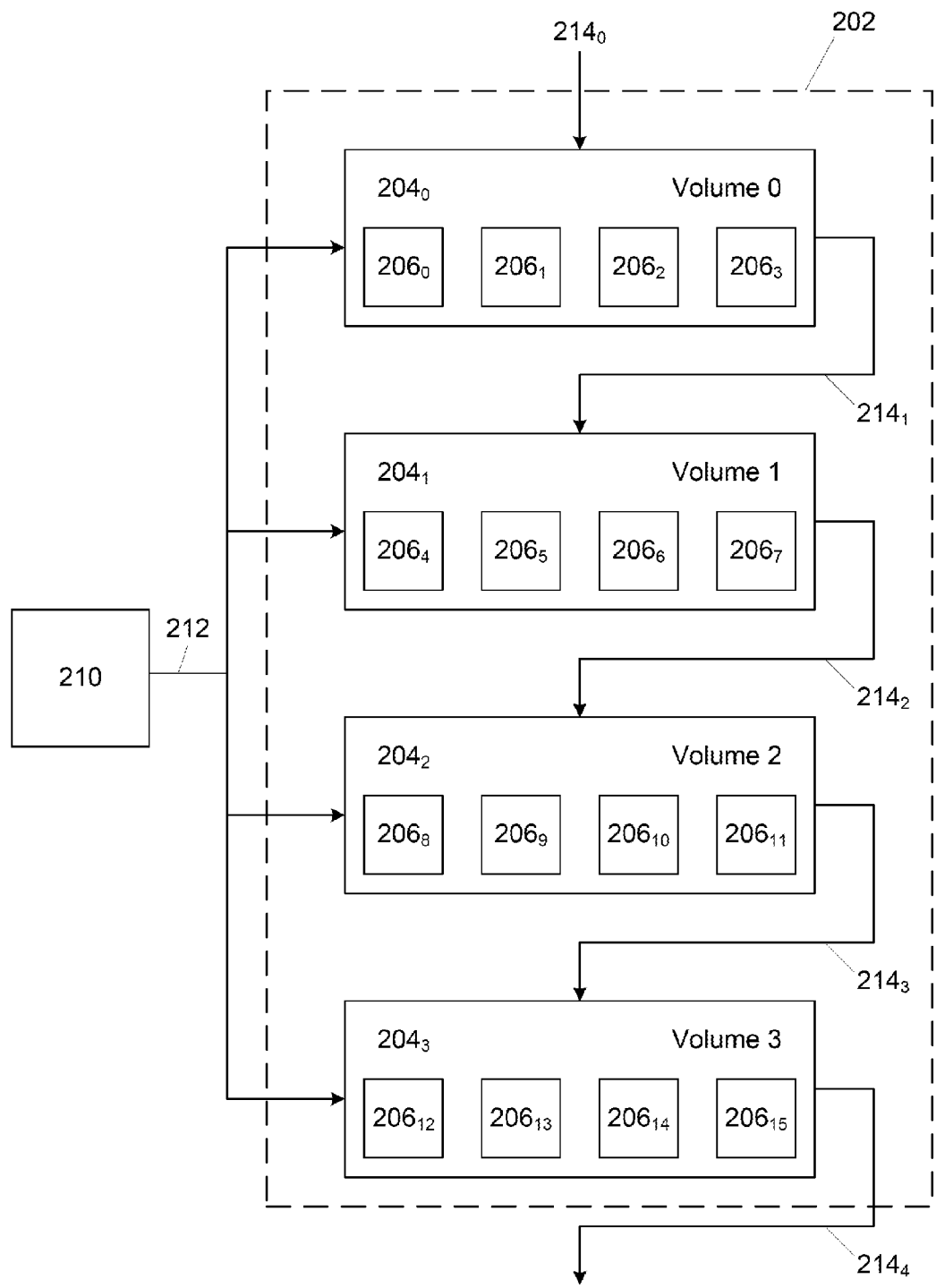
FIG. 2 is a schematic depiction illustrating a memory array being addressed with a single chip enable signal for an entire memory array, according to one embodiment of the present description.

FIG. 2 illustrates an embodiment of the present description wherein only a single chip enable signal is required to address an entire memory array, regardless of the number of memory modules or memory units. FIG. 2 shows a non-volatile memory array 202 comprising (for illustration purposes) four (4) memory modules $204_0$, $204_1$, $204_2$, and $204_3$, each having four (4) memory units or microelectronic memory chips per memory module (i.e. memory module $204_0$ having memory units $206_0$-$206_3$, memory module $204_1$ having memory units $206_4$-$206_7$, memory module $204_2$ having memory units $206_8$-$206_{11}$, and memory module $204_3$ having memory units $206_{12}$-$206_{15}$). It is understood that the four memory module by four memory unit per memory module (i.e. sixteen (16) total memory units) arrangement for the non-volatile memory array 202 of FIG. 2 is merely exemplary and may be any appropriate size (i.e. any appropriate number of memory modules and any appropriate number of memory units within each memory module). The memory modules (e.g. $204_0$, $204_1$, $204_2$, $204_3$, and the like) may hereinafter be collectively referred to as $204_n$ (where n is any of a selected number of memory modules) and the memory units (e.g. $206_0$-$206_{15}$, and the like) may hereinafter be collectively referred to as memory units $206_m$ (where m is any of a selected number of memory units).

As shown in FIG. 2, a single chip enable signal 212 may be issued from a host controller 210 that may be connected in parallel with each of the memory modules $204_n$ within a memory array 202. A first enable in/out signal $214_0$ may be connected to a first memory module (illustrated as memory module $204_0$ in FIG. 2) of the memory array 202 to facilitate addressing the memory module (e.g. memory module $204_0$) and its respective memory units (e.g. memory units $206_0$-$206_3$), as will be discussed. Each of the memory modules (e.g. memory modules $204_0$-$204_3$) that are adjacent to one another may be sequentially connected with enable in/out signals (e.g. $214_1$-$214_3$). Thus, as illustrated in FIG. 2, the first module $204_0$ may be connect with a second enable in/out signal $214_1$ to the second module $204_1$, the second module $204_1$ may be connected with a third enable in/out signal $214_2$ to the third module $204_2$, and the third module $204_2$ may be connected with a third enable in/out signal $214_2$ to the fourth module $204_3$. In the illustration of FIG. 2, the fourth module $204_3$ may be the last memory module in the memory array 202 and may output a final enable in/out signal, shown as fourth enable in/out signal $214_4$. The sequential connection of the memory modules $204_n$ may effectively form a daisy chain, as will be understood to those skilled in the art.

Figure 3:
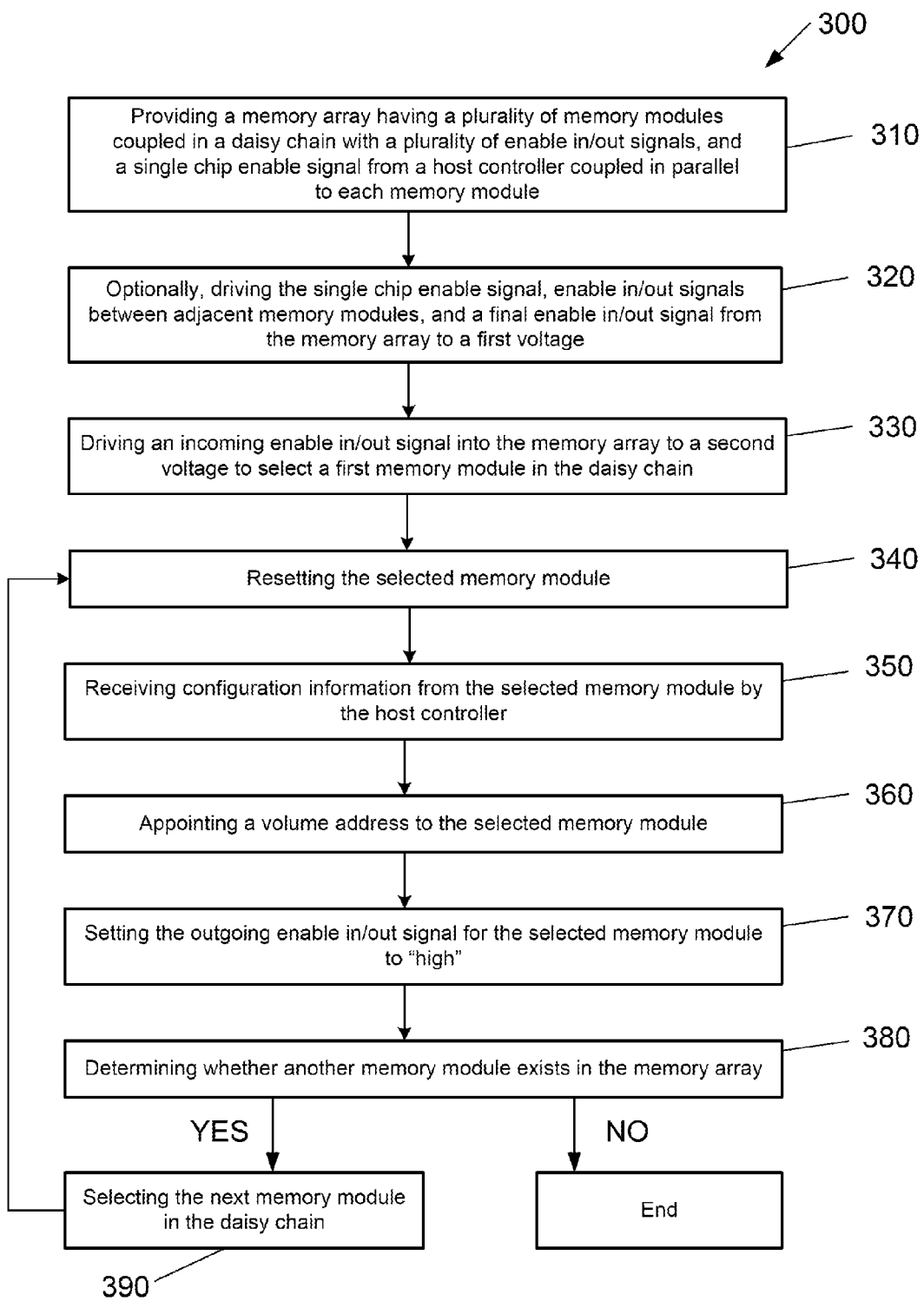
FIG. 3 is a flow diagram of addressing a memory array with a single chip enable signal, according to one embodiment of the present description.

FIG. 3 shows a flow diagram of a process 300 of sequentially addressing memory modules within a memory array using a single chip enable signal (as illustrated in FIG. 2). As shown in block 310, a memory array having a plurality of memory modules coupled in a daisy chain with enable in/out signals and a single chip enable signal coupled in parallel to each memory module may be provided. The daisy chain may comprise each memory module having an incoming enable in lout signal and which generates an outgoing enable in/out signal, and wherein adjacent memory modules may be sequentially coupled such that the outgoing enable in/out signal of a memory module may be the incoming enable in/out signal to an adjacent memory module.

As shown in block 320, the chip enable signal, the enable in/out signals between adjacent memory modules, and the final enable in/out signal from the memory array may be optionally driven to a first voltage. It is understood that the first voltage need not be driven.

As shown in block 330, an incoming enable in/out signal into the memory array may be driven to a second voltage, which differs from the first voltage, which selects a specific memory module. A memory module is "selected" when the incoming enable in/out signal is at a second voltage and its outgoing enable in/out signal is at a differing voltage, e.g. at the first voltage. It is understood the first voltage and the second voltage need only be detectably different from one another. Thus, the first voltage may be either higher or lower than the second voltage.

As shown in block 340, the selected memory module may be reset by a reset command sent by the host controller (e.g. reset command is only accepted by a selected memory module).

As shown in block 350, the selected memory module configuration information may be received by the host controller. This configuration identifies information for the memory units within the selected memory module, which may be hard-coded in the memory module.

As shown in block 360, the host controller may appoint a volume address to the selected memory module. The volume address for each memory module is shown in FIG. 2, as "Volume 0" for memory module $104_0$, "Volume 1" for memory module $104_1$ "Volume 2" for memory module $104_2$, and "Volume 3" for memory module $104_3$. The combination of a volume address for the memory module and the configuration information of the memory units, uniquely addresses each memory unit.

As shown in block 370, the outgoing enable in/out signal from the selected memory module may be set to the second voltage, which "deselects" that memory module. As shown in block 380, a determination is made as to whether another memory module exists in sequence. This may be achieved by a signal send by the host controller, such as a Read ID signal, to check for a response. It is understood that the setting the outgoing enable in/out signal from the selected memory need not mean that it is driven. Rather, it merely needs to not be at the first voltage and a subsequent memory module incoming enable in/out signal is allowed to pull up, as will be understood to those skilled in the art.

As shown in block 390, if another memory module exists the second voltage level of outgoing enable in/out signal from the previous memory module becomes the second voltage level of the incoming enable in/out signal for next memory module, which "selects" that memory module (i.e. the incoming enable in/out signal at a second voltage and the outgoing enable in/out signal at a first voltage), and block 330, block 340, block 350, block 360, and block 370 are repeated. If another memory module does not exist, then the addressing of the memory array ends. It is understood that the determination of whether another memory module exists in the daisy chain could be achieved by sending the last enable in/out signal back to the controller. However, this would require adding an additional signal or pin to the controller, as will be understood to those skilled in the art.

It will be understood that uniquely addressing the memory units in the manner described need only occur once during a single power cycle. Each power cycle will, of course, require addressing the memory units again in the manner described. It is also understood that the memory units could be re-addressed at any point during operation of a memory system, as desired. Furthermore, it is understood that although the volumes are illustrated as being appointed sequentially, they may be appointed in a predetermined non-sequential sequence, such as for layout reasons, or may be appointed randomly, such as for load level purposes, as will be understood to those skilled in the art.

Figure 4:
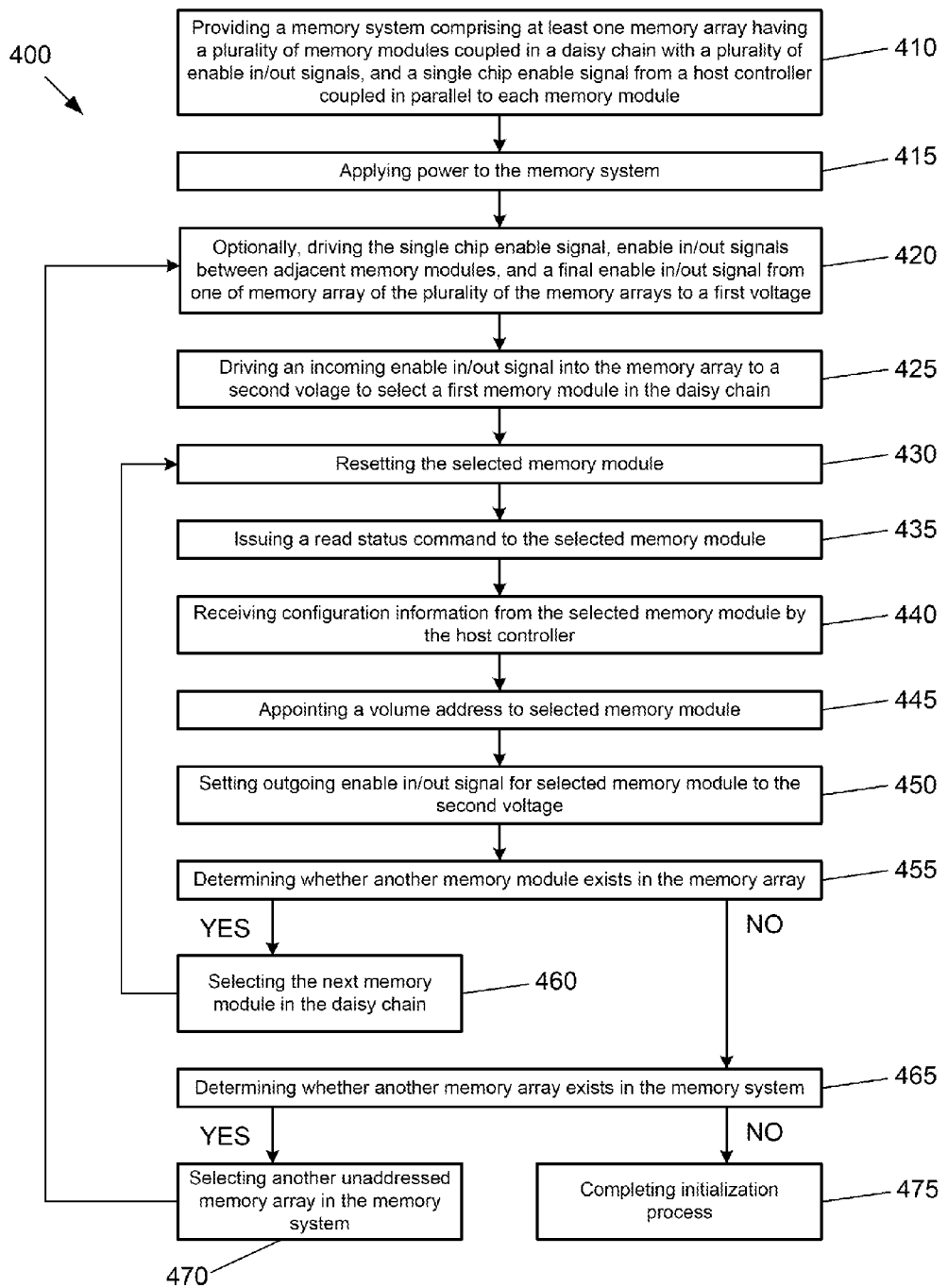
FIG. 4 is a flow diagram of initializing a memory system including addressing each memory array with a single chip enable signal, according to one embodiment of the present description.

FIG. 4 illustrates a process for utilizing a sequential addressing system 400 of the present description with a serial reset for memory modules within a memory array for addressing a memory system. As shown in block 410, a memory system may be provided which may comprise at least one memory array having a plurality of memory modules coupled in a daisy chain with enable in/out signals and a single chip enable signal coupled in parallel to each memory module. The daisy chain may comprise each memory module having an incoming enable in/out signal and which generates an outgoing enable in/out signal, wherein adjacent memory modules may be sequentially coupled such that the outgoing enable in/out signal of a memory module may be the incoming enable in/out signal to an adjacent memory module.

As shown in block 415, power may be applied to the memory system.

As shown in block 420, the chip enable signal (referred to in the art as "CE_n") for one of the plurality of memory arrays, the enable in/out signals between adjacent memory modules associated with the memory array, and the final enable in/out signal from the memory array may be optionally driven to a first voltage. Again, it is understood that the first voltage need not be driven.

As shown in block 425, an incoming enable in/out signal into the memory array may driven to a second voltage, which differs from the first voltage, which selects a specific memory module. Again, a memory module is "selected" when the incoming enable in/out signal is at a second voltage and its outgoing enable in/out signal is at a differing voltage, e.g. at the first voltage. It is understood the first voltage and the second voltage need only be detectably different from one another. Thus, the first voltage may be either higher or lower than the second voltage.

As shown in block 430, the selected memory module may be reset by a reset command sent by a host controller. In one embodiment, a host controller may issue a read status command (referred to in the art as Read Status (70h) command) prior to any other command to indicate sequential reset for each memory module, the host controller may then issue a reset command (referred to in the art as Reset (FFh)) which resets the memory module connected to the chip enable (referred to in the art as CE_n (Host Target)) whose incoming enable in/out signal is at a second voltage and whose outgoing enable signal is at a first voltage.

As shown in block 435, the host controller may issue a read status command to the memory module. As will be understood by those skilled in the art, this may comprise issuing a Read Status (70h) command and waiting until the Status Register bit 6 or SR[6] is set to one.

As shown in block 440, the host controller may configure the memory module with identification of the memory units therein. In one embodiment, the host controller may issue commands, such as Read ID (identification of target specification support), Read Parameter Page (identification of memory modules organization, features, timings, and other behavioral parameters), and the like, as known in the art, to configure the memory module.

As shown in block 445, a volume address may be appointed to the selected memory module. In one embodiment, a "Set Feature" command with a "Feature Address of Volume Configuration", as known in the art, may be issued by the host controller to appoint the volume address for the memory module whose incoming enable in/out signal is at a second voltage and whose outgoing enable signal is at a first voltage.

As shown in block 450, the outgoing enable in/out signal from the selected memory module may be set to the second voltage, which "deselects" that memory module. In one embodiment, this occurs after the Set Features command completes, and the memory module may be deselected (until a Volume Select command (referred to in the art as "E1h") is issued that selects the Volume). It will be understood to those skilled in the art that the host will not issue another command to the memory module connected to the chip enable signal until after the busy time for Set Features and Get Features (i.e. "tFEAT") has elapsed.

As shown in block 455, whether there is another memory module in the memory array may be determine. If another memory module is detected, the next memory module in the daisy chain is selected, as shown in block 460 and the operations of block 430, block 435, block 440, block 445, block 450, and block 455 are repeated for the detected memory module. As shown in block 465, if another memory module is not detected, then whether there is another unaddressed memory array in the memory system may be determined. If another unaddressed memory array is found or detected, then the next chip enable signal associate with a different memory array may be selected, as shown in block 470 and the operations of block 420, block 425, block 430, block 435, block 440, block 445, block 450, block 455, and block 465 are repeated until all memory arrays are addressed.

As shown in block 475, when no unaddressed memory arrays are found, the initialization process is completed. In one embodiment, initialization process is completed by a Volume Select command (E1h) issued following a chip enable signal (CE_n) transition from high to low to select the next Volume that is going to execute a command, as will be understood to those skilled in the art.

It is understood that the non-volatile memory units of the present description may include, but is not limited to NAND memory units (flash memory using NAND logic gates), NOR memory (flash memory using NOR logic gates) units, PCM (phase change memory) units, MRAM (magnetoresistive random access memory) units, and the like. In one specific embodiment of the present description, the non-volatile memory comprises NAND memory units.

Figure 5:
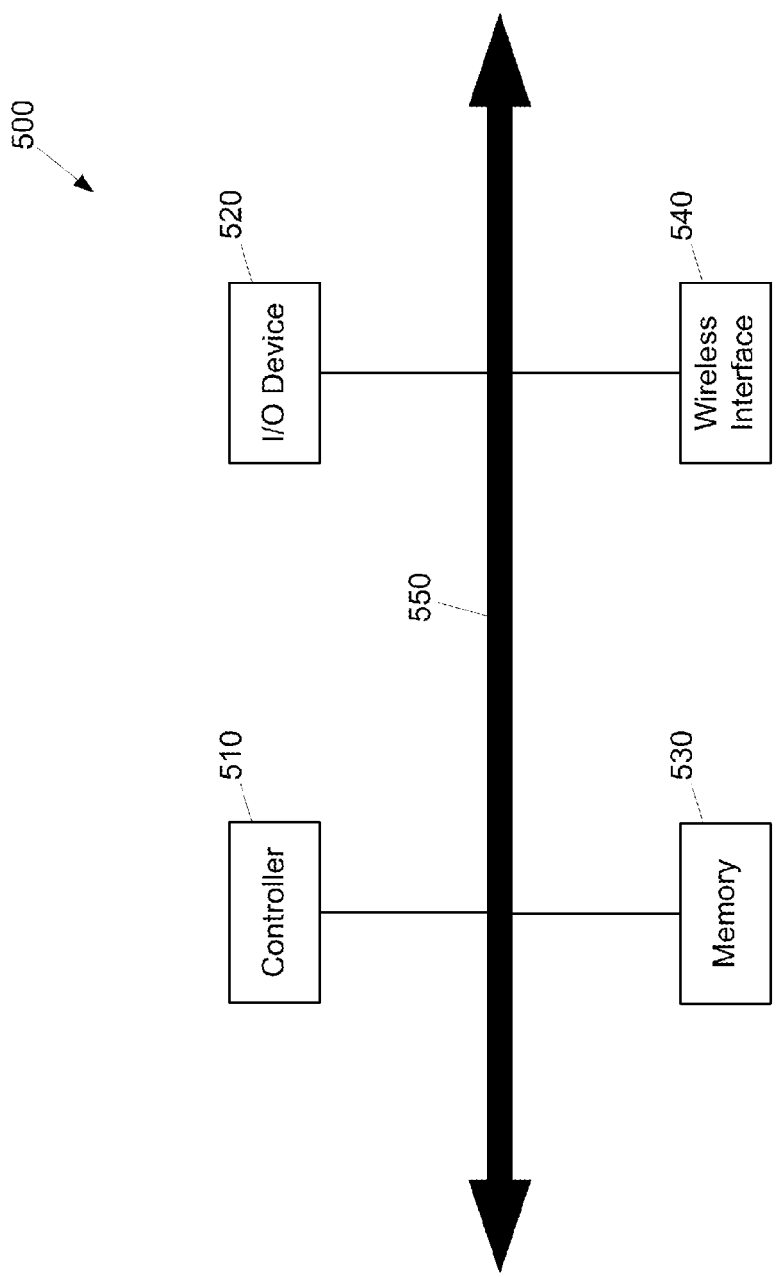
FIG. 5 is a schematic depiction of a system in accordance with one embodiment of the present description.

FIG. 5 illustrates an example of a microelectronic system 500 utilizing the subject matter of the present description. The microelectronic system 500 may be any electronic device, including but not limited to portable devices, such as a portable computer, a mobile telephone, a digital camera, a digital music player, a web tablet, a personal digital assistant, a pager, an instant messaging device, or other devices, The microelectronic system 500 may be adapted to transmit and/or receive information wirelessly, such as through a wireless local area network (WLAN) system, a wireless personal area network (WPAN) system, and/or a cellular network.

The microelectronic system 500 may include a controller 510, an input/output (I/O) device 520 (e.g. a keypad, display, and the like), a memory 530, and a wireless interface 540 coupled to each other via a bus 550. It is understood that the scope of the present invention is not limited to embodiments having any or all of these components.

The controller 510 may comprise, for example, one or more microprocessors, digital signal processors, application specific integrated circuits, microcontrollers, or the like. The memory 530 may be used to store messages transmitted to or by system 500. The memory 530 may also optionally be used to store instructions that are executed by controller 510 during the operation of system 500, and may be used to store user data. The memory 530 may be a memory system, as discussed herein, comprising at least one memory array having a plurality of memory modules coupled in a daisy chain with enable in/out signals and a single chip enable signal coupled in parallel to each memory module. The daisy chain comprising each memory module having an incoming enable in/out signal and which generates an outgoing enable in/out signal, and wherein adjacent memory modules are sequentially coupled such that the outgoing enable in/out signal of a memory module is the incoming enable in/out signal to an adjacent memory module.

The I/O device 520 may be used by a user to generate a message. The system 500 may use the wireless interface 540 to transmit and receive messages to and from a wireless communication network with a radio frequency (RF) signal. Examples of the wireless interface 540 may include an antenna or a wireless transceiver, although the scope of the present invention is not limited in this respect.

By referencing the microelectronic system 500 of FIG. 5, one skilled in the art will understand that the microelectronic system 500 or a computer may include a computer program product stored on a computer readable memory or medium, wherein the computer program may be adapted to be executed on a computer to select a memory module within a memory array, appoint a volume to the memory module, and address memory units within each memory module using the volume identification and memory unit information hard coded in each memory module, in a manner discussed herein.

Furthermore, it will be understood to those skilled in the art that subject matter of the present description only requires two pins and is scalable for an infinite number of memory arrays, memory modules, and/or memory units. Furthermore, the initial enable in/out signal may be set to Vcc (supply voltage), which may allow for backward compatibility with existing host controllers, as will be understood to those skilled in the art.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. A method of addressing a memory system, comprising:
    providing a memory array having a plurality of memory modules coupled in a daisy chain with a plurality of enable in/out signals, and a single chip enable signal from a host controller coupled in parallel to each memory module;
    optionally, driving the single chip enable signal, enable in/out signals between adjacent memory modules, and a final enable in/out signal from the memory array to a first voltage;
    driving an incoming enable in/out signal into the memory array to a second voltage to select a first memory module in the daisy chain;
    resetting the selected memory module;
    receiving configuration information for the selected memory module by the host controller;
    appointing a volume address to the selected memory module to address memory units within the memory module;
    setting an outgoing enable in/out signal for the selected memory module to the second voltage;
    determining whether another unaddressed memory module exists in the memory array;
    selecting the next memory module in the daisy chain when another unaddressed memory module exists; and
    repeating resetting the selected memory module, receiving configuration information for the selected memory module by the host controller, appointing a volume address to the selected memory module, setting an outgoing enable in/out signal for the selected memory module to the second voltage, and determining whether another memory module exists in the memory array, when another memory module exists.

2. The method of claim 1, wherein appointing a volume address to the selected memory module comprises appointing a sequential volume address to the selected memory module.

3. The method of claim 1, wherein appointing a volume address to the selected memory module comprises appointing a non-sequential volume address to the selected memory module.

4. The method of claim 1, wherein appointing a volume address to the selected memory module comprises appointing a randomized volume address to the selected memory module.

5. The method of claim 1, wherein providing a memory array having a plurality of memory modules coupled in a daisy chain with a plurality of enable in/out signals, and a single chip enable signal from a host controller coupled in parallel to each memory module comprises providing a memory system comprising at least one memory array having a plurality of memory modules coupled in a daisy chain with a plurality of enable in/out signals, and a single chip enable signal from a host controller coupled in parallel to each memory module.

6. The method of claim 1, further including determining whether another determining whether another memory array exists in the memory system after no further memory modules are detected;
    selecting an unaddressed memory array when another memory module is not detected; and
    repeating optionally driving the single chip enable signal, enable in/out signals between adjacent memory modules, and a final enable in/out signal from the memory array to the first voltage, driving an incoming enable in/out signal into the memory array to the second voltage to select a first memory module in the daisy chain, resetting the selected memory module, receiving configuration information for the selected memory module by the host controller, appointing a volume address to the selected memory module, setting an outgoing enable in/out signal for the selected memory module to the second voltage, and determining whether another memory module exists in the memory array, when another memory module exists, and determining whether another unaddressed memory array exists in the memory system when no further unaddressed memory modules are detected.

7. The method of claim 6, further including completing an initialization process when no further unaddressed memory arrays are detected.

* * * * *

UNITED STATES PATENT AND TRADEMARK OFFICE
CERTIFICATE OF CORRECTION

PATENT NO. : 8,462,536 B2
APPLICATION NO. : 13/046248
DATED : June 11, 2013
INVENTOR(S) : Nobunaga et al.

Page 1 of 1

It is certified that error appears in the above-identified patent and that said Letters Patent is hereby corrected as shown below:

On the Title page, in Item [57], line 2, delete "thereof" and insert -- thereof. --, therefor.

In the Claims:

In column 8, line 36, in claim 6, after "determining whether another"
delete "determining whether another".

Signed and Sealed this
Tenth Day of September, 2013

Teresa Stanek Rea
*Acting Director of the United States Patent and Trademark Office*